(12) United States Patent
Lin et al.

(10) Patent No.: US 7,410,895 B2
(45) Date of Patent: Aug. 12, 2008

(54) METHODS FOR FORMING INTERCONNECT STRUCTURES

(75) Inventors: Keng-Chu Lin, Chao-Chou Township, Ping-Tung County (TW); Chung-Chi Ko, Jushan Township, Nantou County (TW); Yi-Chi Liao, Puli Township, Nantou County (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 387 days.

(21) Appl. No.: 11/179,265

(22) Filed: Jul. 12, 2005

(65) Prior Publication Data

US 2007/0015355 A1    Jan. 18, 2007

(51) Int. Cl.
*H01L 21/4763* (2006.01)
(52) U.S. Cl. .................. 438/622; 438/624; 438/629; 438/637; 257/E21.576; 257/E21.579

(58) Field of Classification Search ......... 438/622–625, 438/629, 637–640; 257/E21.575, E21.576, 257/E21.581
See application file for complete search history.

(56) References Cited

U.S. PATENT DOCUMENTS

| 6,475,929 | B1 | 11/2002 | Gabriel et al. |
| 6,713,382 | B1 | 3/2004 | Pangrle et al. ............ 438/622 |
| 2006/0189133 | A1* | 8/2006 | Dimitrakopoulos et al. . 438/687 |

* cited by examiner

*Primary Examiner*—Thanhha Pham
(74) *Attorney, Agent, or Firm*—Thomas, Kayden, Horstemeyer & Risley

(57) ABSTRACT

A method for forming an interconnect structure. A substrate is provided with a low-k dielectric layer thereon. At least one conductive feature is then formed in the low-k dielectric layer. A cap layer is formed overlying the low-k dielectric layer, and the conductive feature and the low-k dielectric layer is then subjected to an energy source to reduce a dielectric constant thereof.

26 Claims, 3 Drawing Sheets

METHODS FOR FORMING INTERCONNECT STRUCTURES

BACKGROUND

The present invention relates to semiconductor fabrication, and in particular to methods for fabricating interconnect structures.

Reduction of integrated circuit size has resulted in levels of electrically conductive interconnects being placed closer together vertically, as well as reduction of the horizontal spacing between the electrically conductive interconnects, such as metal line. As a result, capacitance has increased between such conductive portions, resulting in loss of speed and increased crosstalk. One proposed approach to this problem is to replace the conventional silicon oxide ($SiO_2$) dielectric material, having a dielectric constant (k) of about 4.0, with another insulation material having a lower dielectric constant to thereby lower capacitance.

Unfortunately, low-k dielectric materials have characteristics that make integration into existing integrated circuit structures and processes difficult. Compared to conventional silicon dioxide ($SiO_2$), most low-k materials, due to the inherent structures thereof, typically present disadvantages of low mechanical strength, poor dimensional stability, poor temperature stability, high moisture absorption, permeation, poor adhesion, large thermal expansion coefficient, and unstable stress levels. Thus, the replacement of conventional silicon dioxide ($SiO_2$) with low-k dielectric material in integrated circuit processes or structures becomes problematic, resulting in undesirable increases either in dielectric value of the used low-k material or in RC product (resistance x capacitance) of an integrated circuit structure such as an interconnect structure. Therefore, undesired speed losses and increased crosstalk issue may be happened to the integrated circuit structure.

SUMMARY

Accordingly, an embodiment of the invention provides a method for forming an interconnect structure with improved RC performances. A substrate is provided with a low-k dielectric layer thereon. At least one conductive feature is then formed in the low-k dielectric layer. A cap layer is formed overlying the low-k dielectric layer, and the conductive feature and the low-k dielectric layer is then subjected to an energy source to reduce a dielectric constant of the low-k dielectric layer.

Also provided are methods for recovering dielectric damage of a low-k dielectric layer. In one such embodiment, a low-k dielectric layer is provided with a first dielectric constant. At least one conductive feature is formed in the low-k dielectric layer and the low-k layer has a second dielectric constant higher than the first dielectric constant after formation of the conductive feature. Next, the low-k dielectric layer and the conductive feature are capped with a dielectric layer and the low-k dielectric layer is then subjected to an energy source to recover the second dielectric constant thereof to a third dielectric constant smaller than the second dielectric constant.

Moreover, a method for reducing RC delay is provided. In one such embodiment, a processed interconnect structure with at least one conductive feature formed within a low-k dielectric layer is provided, wherein the interconnect structure having a first RC product. The interconnect structure is covered with a dielectric layer. The interconnect structure is subjected to an energy source to reduce the first RC product to a second RC product.

A detailed description is given in the following embodiments with reference to the accompanying drawings.

BRIEF DESCRIPTION OF THE DRAWINGS

Several embodiments of the invention can be more fully understood by reading the subsequent detailed description and examples with references made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more layers. By use of the term "low dielectric constant" or "low-k" herein, is meant a dielectric constant (k) less than the dielectric constant of a conventional silicon oxide. Preferably, the dielectric constant of the low-k is less than about 4.0.

FIGS. 1-4 are diagrams showing the formation of an interconnect structure according to an embodiment of the invention, respectively illustrating fabrication steps thereof.

Figure 1:
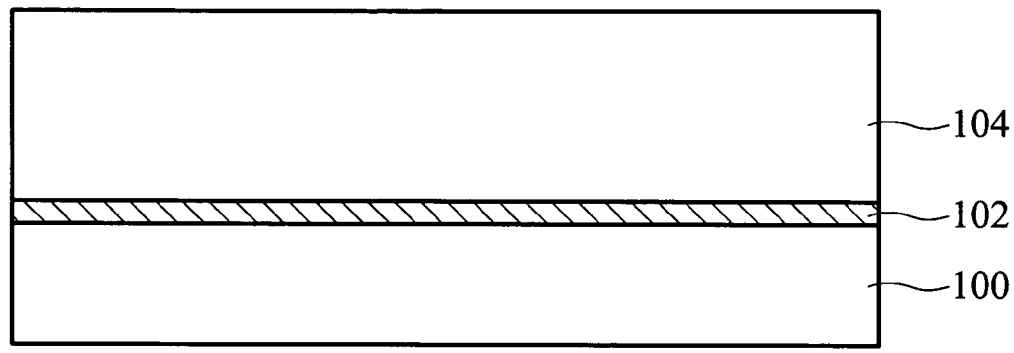
FIGS. 1-5 are cross sections illustrating fraction steps of a method for fabricating an interconnect structure, according to an embodiment of the invention.

In FIG. 1, a semiconductor substrate, for example a silicon substrate, with semiconductor devices or other existing conductive lines thereon, is provided, here shown as a flat substrate 100 for simplicity.

Next, an etch stop layer 102 and a low-k dielectric layer 104 are sequentially formed over the substrate 100 such as chemical vapor deposition (CVD). Herein, the etch shop layer 102 should be sufficient thick, about 50-800 Å, to prevent breakthrough when forming openings such as via openings therein.

Etch stop layer 102 can be, for example, silicon nitride or silicon carbide. Low-k dielectric layer 104 can be a low-k dielectric with an inherent dielectric constant lower than the undoped silicon dioxide of about 4.0, such as carbon-doped silicon dioxide materials, fluorinated silicate glass (FSG), organic polymeric thermoset materials, silicon oxycarbide, SiCOH dielectrics, fluorine doped silicon oxide, spin-on glasses, silsesquioxane, benzocyclobutene (BCB)-based polymer dielectrics, and any silicon containing low-k dielectric.

Preferably, the low-k dielectric of the low-k dielectric layer 104 is carbon-doped, having an inherent k value of about 2-4. In addition, the low-k dielectric utilized in the low-k dielectric layer 104 is preferably porous with a total porosity, or void fraction, of about 5-45% to further lower the inherent k value thereof to about 1.5-3.5.

Figure 2:
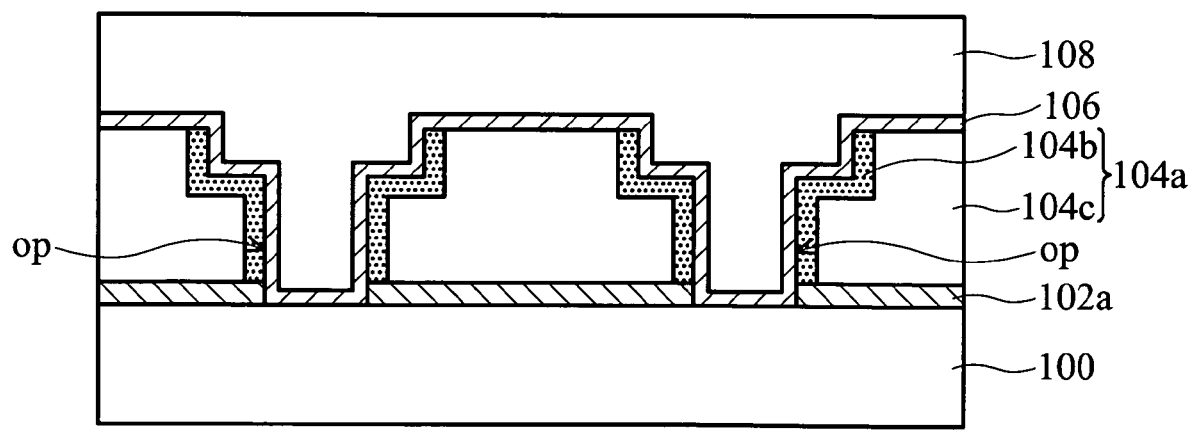

In FIG. 2, a dual damascene process, for example, is then performed to pattern the low-k dielectric layer 104 and the etch stop layer 102 in FIG. 1, thus forming a plurality of openings op therein and leaving the low-k dielectric layer 104a and the etch stop layer 102a on the substrate 100. The low-k dielectric layer 104a may include an optional etch stop layer, not shown here, to provide better etch stop performance during the dual damascene process. Portions of the low-k dielectric layer 104a along the openings op and top surface of the low-k dielectric layer 104a are processed by photolithography, etching and resist ashing in the dual damascene process. Thus, undesired effects such as moisture absorption, etching and ashing are happened to portions of the low-k dielectric layer 104a. This divides the low-k dielectric layer 104a into an affected portion 104b and an inherent portion 104c. The dielectric constant of the affected portion 104b is higher than that of the inherent portion 104c.

Next, a diffusion barrier layer 106 and a bulk conductive layer 108 are sequentially formed in the openings OP and on the low-k dielectric layer 104a. The diffusion barrier layer 106 and the bulk conductive layer 108 can be, for example, titanium nitride (TiN) and copper/copper alloy, respectively.

The diffusion barrier layer 106 is formed between the low-k dielectric layer 104a and the bulk conductive layer 108 to prevent conductive dopants or metal ions of the bulk conductive layer 108 from diffusing into the low-k dielectric layer 104a.

Figure 3:
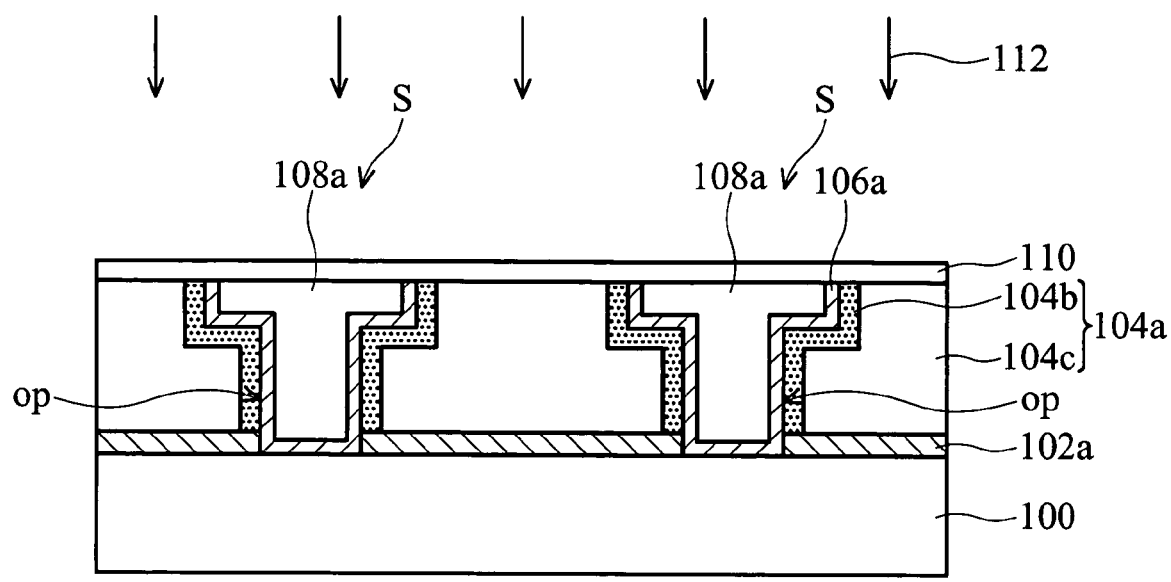

In FIG. 3, the portion of the bulk conductive layer 108 and the diffusion barrier 106 above the surface of the low-k dielectric layer 104a are then removed by, for example, conventional chemical mechanical polishing (CMP). This leaves conductive features S, respectively including a diffusion barrier 106a and a conductive layer 108a, to function as conductive features, such as a contact plug and a conductive line.

Next, a cap layer 110 with a thickness of about 50-800 Å is formed over the low-k dielectric layer 104a and the conductive features S. The cap layer 110 provides stronger atomic bonding than that in the low-k dielectric layer 104a. Preferably, the cap layer 110 is silicon nitride, SiCNH or SiCOH. The affected portions 104b of the low-k dielectric layer 104a affected during the previous processes, such as etching of the low-k dielectric and ashing to a resist layer in photolithography in dual damascene process when forming the conductive features S. Dielectric damages are formed in the low-k dielectric layer 104a and effective dielectric constant thereof is increased. The effective dielectric constant of the low-k dielectric layer 104a is between that of the affected portion 104b and that of the inherent portion 104c.

Next, a treatment 112 is performed on the low-k dielectric layer 104a. During the treatment 112, the low-k layer 104a is subjected to an energy source such as an electron beam (E-beam) or ultraviolet (UV) lights. Such subjection is provided through the cap layer 110 for a predetermined period, to recover the effective dielectric constant of the low-k dielectric layer 104a to a level closer to the inherent dielectric constant of the inherent portion 104c.

The treatment 112 can be provided by ultraviolet lights of wavelength normally less than 480 nm. Preferably, ultraviolet lights has a wavelength between 150-480 nm. Subjection time to the low-k layer 104a through the cap layer 110 is about 0.1-20 minutes. The treatment 112 can also be provided by electronic beam (E-beam) scanning with an energy normally about 0.5-10 KeV, preferably about 2-6 KeV, with about 0.1-20 minutes.

When using carbon-containing material and doped-silicon material, the treatment 112 provides sufficient energy to transform bondings such as silicon-alkyl bondings or silicon-carbon bonding of the damaged portion 104b of the low-k dielectric layer 104a to bondings such as silicon-hydrogen (Si—H) bondings. This reduces the dielectric constant of the affected portion 104b and recovers the effective dielectric constant of the low-k dielectric layer 104a.

In addition, when using porous low-k material, the described rebonding effects may also increase porosity in the affected portion 104b and the inherent portion 104c of the low-k dielectric layer 104a, thus recovering the effective dielectric constant of low-k dielectric layer 104a. However, it is should be noted that illumination by the treatment 112 should be performed below the energy level for transforming bondings of the materials composing the cap layer 110 to prevent the cap layer 110 from decomposing.

Moreover, during the treatment 112, the cap layer 110 protects the low-k dielectric layer 104a from deformation of rebondings of the low-k dielectric therein. The cap layer 110 can also function as an etch stop layer for subsequent processes.

Figure 4:
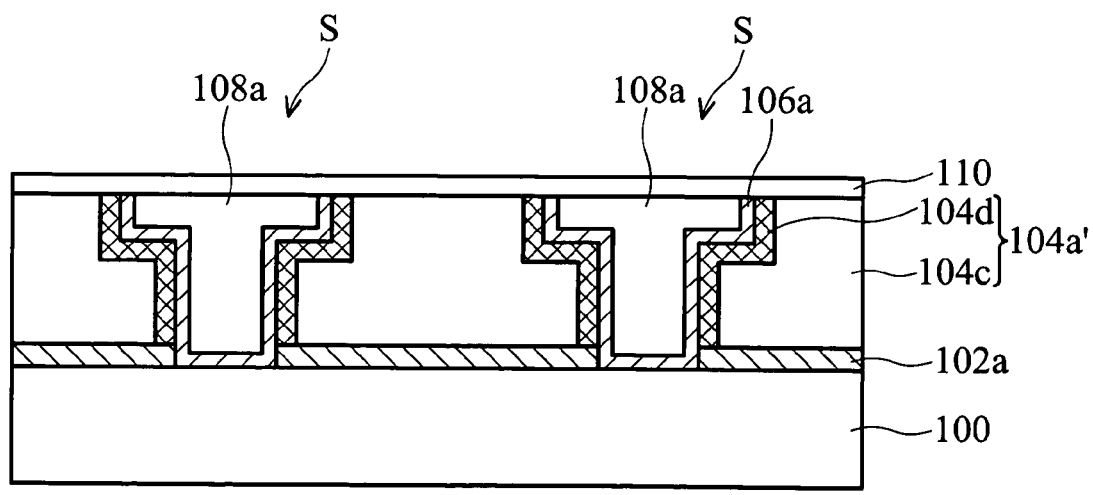
Figure 5:
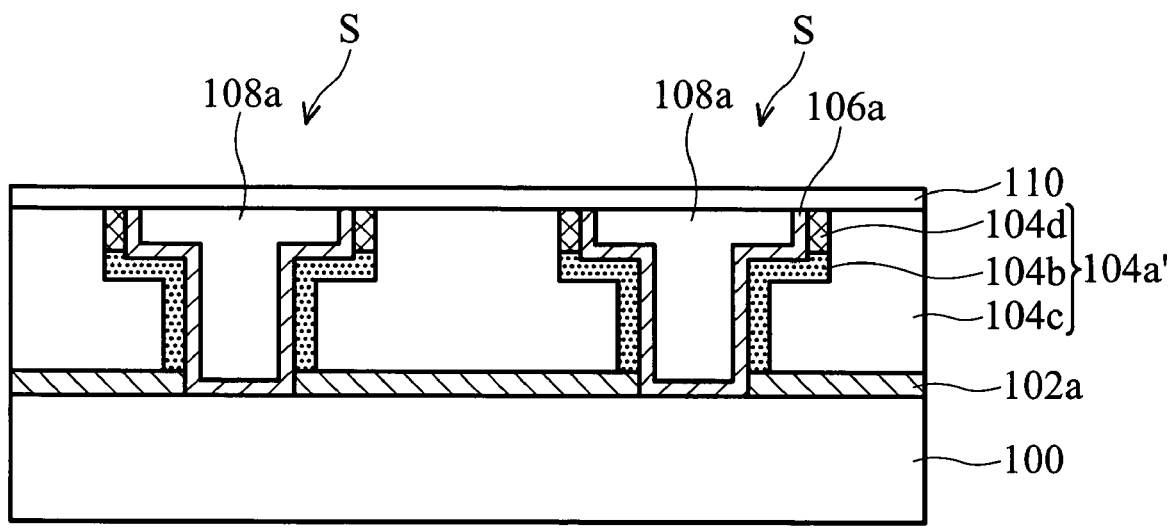

In FIG. 4, after the treatment 112, a low-k dielectric layer 104a' with recovered portion 104d and inherent portion 104c is thus obtained. The affected portion 104b shown in FIG. 3 is totally recovered, and dielectric constant thereof is lowered. Moreover, the affected portion 104b may be partly recovered by the treatment 112 shown in FIG. 3 and a affected portion 104b may still remain in the interconnect structure, as shown in FIG. 5. The low-k dielectric layer 104' has an effective dielectric constant between that of the dielectric material in the inherent portion 104c and that of the low-k dielectric layer 104a shown in FIG. 3. Dielectric constant recovery of a low-k dielectric layer is thus achieved. Therefore, the overall dielectric constant of the low-k dielectric layer 104a or 104a' is thus reduced and the bulk capacitance thereof can be also reduced by the treatment 112. Thus, RC product of the interconnect structure illustrated in FIGS. 4 and 5 can be thus improved since at least that the bulk capacitance of the low-k dielectric therein is reduced.

Moreover, the described treatment 112 not only reduces the bulk capacitance of the low-k dielectric layer through recovering damaged portions thereof but also reduces the resistance of the conductive features S formed within the low-k dielectric layer. Therefore, RC product of the interconnect structures treated by the treatment 112, such as those illustrated in FIGS. 4 and 5 may be thus improved to a value less than that does not treated by the treatment 112 to provide an interconnect structure with reduced RC delay issue. Improvement observed by the inventors is about 5%.

By using methods, such as the embodiments described above, RC performance of an interconnect structure using low-k dielectric, such as a copper interconnect incorporated with low-k dielectric layer, can be improved due to the dielectric damage recovery of the low-k layer therein.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an interconnect structure, comprising:
   providing a substrate with a low-k dielectric layer thereon;
   forming at least one conductive feature in the low-k dielectric layer;
   forming a cap layer overlying the low-k dielectric layer and the conductive feature; and
   subjecting the cap layer and the low-k dielectric layer to an energy source to reduce a dielectric constant thereof, wherein no layer is formed between the cap layer and the low-k dielectric layer while subjecting the cap layer and the low-k dielectric layer to the energy source, wherein the cap layer protects the low-k dielectric layer from deformation of rebondings therein.

2. The method of claim 1, wherein the energy source is an electron beam (E-beam).

3. The method of claim 2, wherein the E-beam takes place at an energy between 0.5-10 KeV.

4. The method of claim 2, wherein the low-k dielectric layer is subjected to the E-beam for about 0.1-20 minutes.

5. The method of claim 1, wherein the low-k dielectric layer is subjected to an ultraviolet (UV) light.

6. The method of claim 5, wherein the ultraviolet (UV) light has a wavelength of about 150-480 nm.

7. The method of claim 5, wherein the low-k dielectric layer is subjected to the ultraviolet (UV) light for about 0.1-20 minutes.

8. The method of claim 1, wherein the low-k dielectric layer comprises carbon-containing dielectric material.

9. The method of claim 1, wherein the low-k dielectric layer is porous.

10. The method of claim 1, wherein the subjection the low-k dielectric layer to an energy source forms a plurality of Si—H bonds in the low-k dielectric layer.

11. A method for dielectric constant recovery, comprising:
providing a low-k dielectric layer with a first dielectric constant;
forming at least one conductive feature in the low-k dielectric layer, the low-k layer having a second dielectric constant higher than the first dielectric constant after forming the conductive feature;
capping the low-k dielectric layer and the conductive feature with a dielectric layer; and
subjecting the dielectric layer and the low-k dielectric layer to an energy source to recover the second dielectric constant of the low-k dielectric layer to a third dielectric constant smaller than the second dielectric constant, wherein no layer is formed between the dielectric layer and the low-k dielectric layer while subjecting the dielectric layer and the low-k dielectric layer to the energy source, wherein the dielectric layer capping the low-k dielectric layer protects the low-k dielectric layer from deformation of rebondings therein.

12. The method of claim 11, wherein the energy source is an electron beam (E-beam).

13. The method of claim 12, wherein E-beam takes place at energy between 0.5-10 KeV.

14. The method of claim 12, wherein the low-k dielectric layer is subjected to the E-beam for about 0.1-20 minutes.

15. The method of claim 11, wherein the low-k dielectric layer is subjected to an ultraviolet (UV) light.

16. The method of claim 15, wherein the UV light has a wavelength of about 150-480 nm.

17. The method of claim 15, wherein the low-k dielectric layer is subjected to the UV light for about 0.1-20 minutes.

18. The method of claim 11, wherein the low-k dielectric layer comprises carbon-containing dielectric material.

19. The method of claim 11, wherein the low-k dielectric layer is porous.

20. The method of claim 11, wherein subjection of the low-k dielectric layer to an energy source forms a plurality of Si—H bonds in the low-k dielectric layer.

21. The method of claim 11, wherein the first dielectric constant is less than 4.0.

22. A method for reducing RC delay, comprising:
providing an processed interconnect structure with at least one conductive feature formed in an low-k dielectric layer, wherein the interconnect structure having a first RC product;
capping the interconnect structure with a dielectric layer; and
subjecting the dielectric layer and the interconnect structure to an energy source to reduce the first RC product to a second RC product, wherein no layer is formed between the dielectric layer and the interconnect structure while subjecting the dielectric layer and the interconnect structure to the energy source, wherein the dielectric layer capping the low-k dielectric layer protects the low-k dielectric layer from deformation of rebondings therein.

23. The method of claim 22, wherein the energy source is an electron beam (E-beam) or ultraviolet (UV) light.

24. The method of claim 23, wherein E-beam takes place at energy between 0.5-10 KeV.

25. The method of claim 23, wherein the interconnect structure is subjected to the energy source for about 0.1-20 minutes.

26. The method of claim 23, wherein the ultraviolet (UV) light has a wavelength of about 150-480 nm.

* * * * *